United States Patent
Cecco et al.

(10) Patent No.: US 9,995,784 B2
(45) Date of Patent: Jun. 12, 2018

(54) METHOD AND CIRCUIT FOR DETERMINING FAULTS IN APPLIANCES

(71) Applicant: Electrolux Appliances Aktiebolag, Stockholm (SE)

(72) Inventors: Alessandro Cecco, Sedegliano (IT); Paolo Driussi, Zoppola (IT)

(73) Assignee: ELECTROLUX APPLIANCES AKTIEBOLAG, Stockholm (SE)

( * ) Notice: Subject to any disclaimer, the term of this patent is extended or adjusted under 35 U.S.C. 154(b) by 17 days.

(21) Appl. No.: 15/102,948

(22) PCT Filed: Dec. 9, 2013

(86) PCT No.: PCT/EP2013/075983
§ 371 (c)(1),
(2) Date: Jun. 9, 2016

(87) PCT Pub. No.: WO2015/086041
PCT Pub. Date: Jun. 18, 2015

(65) Prior Publication Data
US 2016/0377673 A1    Dec. 29, 2016

(51) Int. Cl.
*G01R 31/28* (2006.01)
*G01R 31/02* (2006.01)
(Continued)

(52) U.S. Cl.
CPC ...... *G01R 31/2825* (2013.01); *A47L 15/0049* (2013.01); *A47L 15/4293* (2013.01);
(Continued)

(58) Field of Classification Search
CPC ...... G01R 31/00; G01R 31/002; G01R 31/02; G01R 31/024; G01R 31/025; G01R 31/08;
(Continued)

(56) References Cited

U.S. PATENT DOCUMENTS 4,394,647 A * 7/1983 Van Dine ............. G01R 19/155
324/133
6,441,679 B1 * 8/2002 Ohshima ............ H03K 17/0822
323/282
(Continued)

FOREIGN PATENT DOCUMENTS

| EP | 2343786 A2 | 7/2011 |
| EP | 2386675 A1 | 11/2011 |
| EP | 2386680 A1 | 11/2011 |

OTHER PUBLICATIONS

International Search Report in corresponding International Application No. PCT/EP2013/075983, dated Aug. 12, 2014.

*Primary Examiner* — Hoai-An D Nguyen
(74) *Attorney, Agent, or Firm* — Ratnerprestia

(57) ABSTRACT

A washing and/or drying appliance circuit system having an electric load, first and second power supply terminals, first and second switching elements operable for coupling/decoupling the power supply terminals to terminals of the electric load, a control unit for operating the switching elements, and a conditioning arrangement. The conditioning arrangement has a unidirectional signal flow element coupled between the first supply terminal for receiving a supply signal and the second load terminal, and an impedance arrangement coupled between the first load terminal and the control unit. With the first and second switching elements in the opened-states the first supply terminal, the unidirectional signal flow element, the electric load and the impedance arrangement define a conductive path providing a check signal to the control unit. The control unit is configured for determining a fault in the circuit system based on the check signal.

25 Claims, 9 Drawing Sheets

Figure 1:
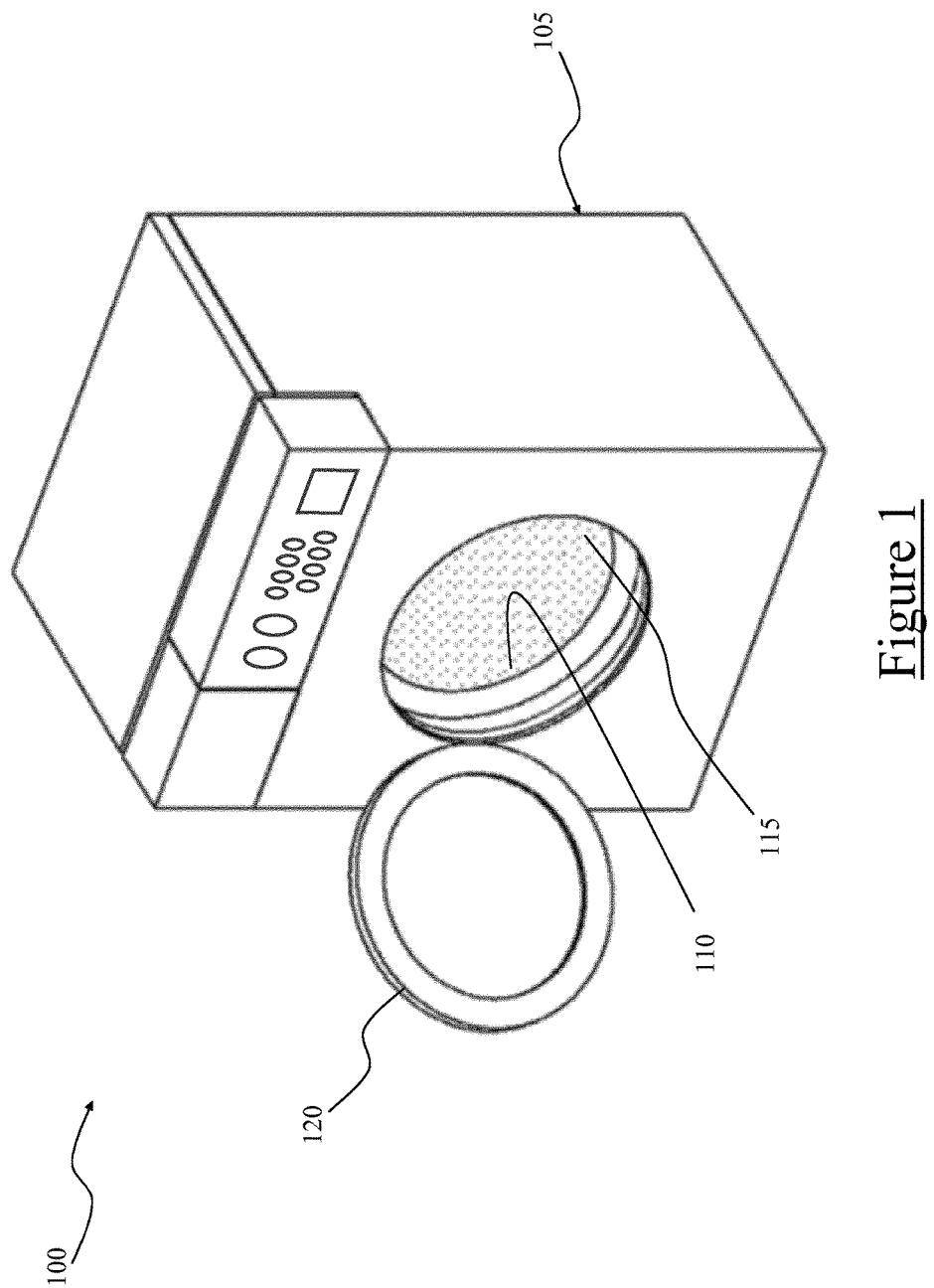

(51) Int. Cl.
*A47L 15/00* (2006.01)
*D06F 37/42* (2006.01)
*A47L 15/42* (2006.01)
*D06F 25/00* (2006.01)
*D06F 33/02* (2006.01)
*D06F 39/04* (2006.01)
*D06F 58/28* (2006.01)

(52) U.S. Cl.
CPC .............. *D06F 25/00* (2013.01); *D06F 33/02* (2013.01); *D06F 37/42* (2013.01); *D06F 39/04* (2013.01); *D06F 58/28* (2013.01); *G01R 31/025* (2013.01); *D06F 2058/2887* (2013.01)

(58) Field of Classification Search
CPC ...... G01R 31/10; G01R 31/28; G01R 31/282; G01R 31/2825; G01R 27/18; G01R 27/2617; H04L 41/0677; D06F 25/00; D06F 33/02; D06F 37/42; D06F 39/04; D06F 58/28; D06F 2058/2887; A47L 15/0049; A47L 15/4293
USPC ....... 324/500, 509, 510, 511, 512, 519, 522, 324/523, 527, 528, 531, 537
See application file for complete search history.

(56) References Cited

U.S. PATENT DOCUMENTS

| | | | |
|---|---|---|---|
| 8,618,813 B2 * | 12/2013 | Ishii | H02H 3/162 |
| | | | 324/541 |
| 2009/0206816 A1 | 8/2009 | Henle et al. | |
| 2013/0300491 A1 * | 11/2013 | Boe | H01H 9/548 |
| | | | 327/365 |
| 2016/0203932 A1 * | 7/2016 | Niehoff | H01H 9/542 |
| | | | 361/170 |
| 2016/0315460 A1 * | 10/2016 | Gao | G01R 31/025 |
| 2017/0047726 A1 * | 2/2017 | Pan | H02H 3/33 |

* cited by examiner

METHOD AND CIRCUIT FOR DETERMINING FAULTS IN APPLIANCES

FIELD OF THE INVENTION

The invention generally relates to electric appliances, such as washing, drying, washing/drying, and dishwashing appliances, both for domestic and professional use. More particularly, the invention relates to determination of faults in such appliances.

BACKGROUND OF THE INVENTION

Electric household and professional electric appliances (hereinafter, appliance(s), for the sake of conciseness) typically comprises an inner compartment accommodating a drum accessible by a user for loading items (e.g., laundry or dishware) to be treated (e.g., washed and/or dried) and unloading the items after the intended treatment has been accomplished, as well as (e.g., electric/electro-hydraulic/electro-mechanical) components (part of a circuit system of the appliance) for accomplishing the intended treatment.

Such components typically comprise electric loads (such as electric motors and electric washing/heating resistors) selectively coupleable, for their energization, between line and neutral terminals of an AC electric power supply, as well as switching devices operable for allowing such selective coupling.

As known, many faults may affect such components, such as electric loads leakage, and/or switching devices failures.

Considering for example insulation issues arising in electric washing/heating resistors (e.g., due to usage wear, overheating, contaminants and/or mechanical stress), undesired electric power (e.g., electric current) may leak towards ground (thereby increasing power consumption, or, even worse, posing safety hazards for a user), or towards the line or neutral terminals (thereby impairing the intended treatment, and, finally, damaging the whole appliance).

Considering instead failures (e.g., missing switching) arising in the switching devices (e.g., due to control errors or any, temporary or permanent, mechanical malfunction), an undesired electric load may be energized instead of the intended one (thereby impairing the intended treatment).

Most of known solutions aimed at faults determination are based on monitoring of electrical quantities (i.e., current and/or voltage) of each component potentially affected by faults.

EP2386675 discloses a washing and/or drying appliance, comprising a heating circuit for heating a washing liquid and/or a drying air flow, the heating circuit being connected to voltage distribution lines distributing power inside the appliance and comprising at least one heating resistor in series to switch means controlled by an appliance control unit for selectively energizing the heating resistor when required. The switch means of the heating circuit comprise a first and a second switches in series to the heating resistor, the heating resistor being interposed between the first and second switch. A monitoring circuit arrangement is associated with the heating circuit, said monitoring circuit arrangement comprising a resistive network including a first resistor connected to the heating circuit so as to be bypassed when the first switch is closed, the heating resistor, and a second resistor connected to the heating circuit so as to be bypassed when the second switch is closed, the monitoring circuit arrangement further comprising a current sensor arranged to measure a current flowing through the resistive network and to feed an indication of the measured current to the control unit. The monitoring unit is configured for assessing possible faults of the heating circuit based on the indication of the measured current.

EP2386680 discloses a washing and/or drying appliance, comprising a heating circuit for heating a washing liquid and/or a drying air flow, connected to voltage distribution lines distributing power inside the appliance and comprising at least one heating resistor in series to switch means controlled by an appliance control unit for selectively energizing the heating resistor when required. The switch means of the heating circuit comprise a first and a second switches in series to the heating resistor, the heating resistor being interposed between the first and second switches. A monitoring circuit arrangement is provided, said monitoring circuit arrangement comprising a first resistor in shunt to the heating resistor and having a resistance substantially higher than that of the heating resistor, and a pull-up network connected between a first terminal of the heating resistor and one of the voltage distribution lines, the control unit being configured for receiving a voltage corresponding to an electric potential at a second terminal of the heating resistor.

SUMMARY OF SELECTED INVENTIVE ASPECTS

The Applicant has realized that the known solutions are not satisfactory for modern technological requirements.

In particular, faults determination based on monitoring of electrical quantities of each component (potentially affected by faults) needs relatively high computational processing (and thus monitoring circuits having relatively high complexity). Due to high complexity, monitoring circuits can not be easily and costlessly replicated for determining faults affecting other components of the appliance.

If, on the one hand, implementation of a relatively high number of monitoring circuits is not a feasible approach, on the other hand a relatively low number of monitoring circuits has a very limited effectiveness in determining all (or at least a relevant number of) faults (as for EP2386675 and EP2386680).

The Applicant has tackled the problem of devising a satisfactory solution able to overcome the above-discussed, and other, drawbacks.

One or more aspects of the solution according to embodiments of the invention are set out in the independent claims, with advantageous features of the same solution that are indicated in the dependent claims.

An aspect of the solution according to one or more embodiments of the invention relates to a washing and/or drying appliance. The washing and/or drying appliance has a circuit system comprising: an electric load adapted to be energized by electrical coupling between first and second supply terminals of an electric power supply; first and second switching elements operable between respective closed/opened states for coupling/decoupling the first and second power supply terminals to/from first and second load terminals of the electric load; a control unit for operating the first and second switching elements, and a conditioning arrangement. The conditioning arrangement has a unidirectional signal flow element coupled between the first supply terminal for receiving a supply signal and the second load terminal, and an impedance arrangement coupled between the first load terminal and the control unit. With the first and second switching elements in the opened-states the first supply terminal, the unidirectional signal flow element, the electric load and the impedance arrangement define a conductive path providing a check signal to the control unit, the control unit being configured for determining a fault in the circuit system based on the check signal.

According to an embodiment of the invention, the impedance arrangement is a voltage divider, so that the check signal is scaled, with respect to the supply signal, by a scaling factor of the voltage divider.

According to an embodiment of the invention, the impedance arrangement is powered between a reference voltage and an operative voltage, so that the check signal is also shifted, with respect to the supply signal, by a shifting voltage depending on said operative and reference voltages.

According to an embodiment of the invention, the control unit is powered between said operative and reference voltages so that the check signal falls between an operation swing of the control unit.

According to an embodiment of the invention, the first switching element is a door switch, in the closed-state the door switch allowing a mechanical lock of an appliance door for preventing access to a treatment chamber of the appliance.

According to an embodiment of the invention, in absence of faults in the circuit system the check signal has a predetermined trend deriving from supply signal passage through said conductive path, a fault in the circuit system affecting the conductive path causing the trend of the check signal to mismatch said predetermined trend. The control unit is configured for determining, with the first and second switching elements in the opened-states, a fault in the circuit system based on a mismatch between the trend of the check signal and the respective predetermined trend.

According to an embodiment of the invention, the supply signal has an alternating full-wave periodic waveform. With the first and second switching elements in the opened-states the predetermined trend of the check signal has a half-wave periodic waveform, and the control unit is configured for determining a leakage between the electric load and the first supply terminal when the actual trend of the check signal takes the full-wave periodic waveform.

According to an embodiment of the invention, with the first and second switching elements in the opened-states the predetermined trend of the check signal has a predetermined peak value depending on sizing of the impedance arrangement, and the control unit is configured for determining a leakage between the electric load and the second supply terminal when the actual trend of the check signal takes the half-wave periodic waveform with a peak value lower than said predetermined peak value by a predefined threshold amount.

According to an embodiment of the invention, the appliance further comprises a first further conditioning arrangement for providing a first further check signal. With the first and second switching elements in the opened-states the predetermined trend of the check signal has a shifting voltage given by first impedance arrangement powering, and the predetermined trend of the first further check signal has the half-wave periodic waveform according to supply signal passage across the unidirectional signal flow element and the first further conditioning arrangement. With the first and second switching elements in the opened-states the control unit is configured for determining a non-conductivity of the electric load when the actual trend of the check signal takes a constant trend at said shifting voltage and the actual trend of the first further check signal matches the respective predetermined trend.

According to an embodiment of the invention, with the first and second switching elements in the off-states the control unit is configured for determining an unwanted on-state of the second switching element when the actual trend of the check signal takes the constant trend at said shifting voltage and the actual trend of the first further check signal takes a constant trend at the reference voltage.

According to an embodiment of the invention, the appliance further comprises a further electric load between the first load terminal and a third load terminal, a third switching element operable for being switched to the second load terminal or to the third load terminal, the closed/opened state of the second switching element allowing coupling/decoupling thereof to/from the third switching element, and a second further conditioning arrangement for providing a second further check signal. With the first and second switching elements in the off-states the predetermined trend of the second further check signal has the half-wave periodic waveform deriving from passage of the supply signal across unidirectional signal flow element and the second further conditioning arrangement, and the control unit is configured for determining a non-conductivity of the further electric load when the actual trend of check signal matches the respective predetermined trend, and the actual trend of the second further check signal takes the constant trend at the reference voltage.

According to an embodiment of the invention, the first further and second further conditioning arrangements comprise first further and second further unidirectional signal flow elements. With the first switching element in the on-state and the second switching element in the off-state the predetermined trends of the first further and second further check signals have the half-wave periodic waveforms deriving from passage of the supply signal across the first further and second further conditioning arrangements, respectively. With the first switching element in the closed-state, the second switching element in the opened-state and the third switching element switched towards the third load terminal, the control unit is configured for determining a non-conductivity of the further electric load or an unwanted on-state of the second switching element when the actual trend of the second further check signal takes the constant trend at the reference voltage.

According to an embodiment of the invention, with the first switching element in the closed-state, the second switching element in the opened-state and the third switching element switched towards the second load terminal, the control unit is configured for determining a non-conductivity of the further electric load when the actual trend of the second further check signal takes the constant trend at the reference voltage, or the control unit is configured for determining a non-conductivity of the electric load or an unwanted on-state of the second switching element when the actual trend of the first further check signal takes the constant trend at the reference voltage.

According to an embodiment of the invention, with the first and second switching elements in the closed-states and the third switching element switched towards the third load terminal, the predetermined trends of the first further and second further check signals have the half-wave periodic waveform and the constant trend at the reference voltage, respectively. With the first and second switching elements in the closed-states and the third switching element switched towards the third load terminal, the control unit is configured for determining an unwanted opened-state of the second switching element when the actual trends of the first further check signal matches the respective predetermined trend and the second further check signal takes the half-wave periodic waveform, or an unwanted switching of the third switching element towards the second load terminal when the actual trend of the first further check signal takes the constant trend at the reference voltage and the actual trend of the second further check signal takes the half-wave periodic waveform.

According to an embodiment of the invention, with the first and second switching elements in the closed-states and the third switching element switched towards the second load terminal the predetermined trends of the first further and second further check signals have the constant trend at the reference voltage and the half-wave periodic waveform, respectively. With the first and second switching elements in the closed-states and the third switching element switched towards the second load terminal the control unit is configured for determining a non-conductivity of the further electric load when the actual trend of the second further check signal takes the constant trend at the reference voltage, or an unwanted off-state of the second switching element when the actual trend of the first further check signal takes the half-wave periodic waveform and the actual trend of the second further check signal matches the respective predetermined trend, or an unwanted switching of the third switching element towards the third load terminal when the actual trend of the first further check signal takes the half-wave periodic waveform and the actual trend of the second further check signal takes the constant trend at the reference voltage.

According an embodiment of the invention, the third switching element is a two-way switch of the "Single Pole Double Throw" type or of the "Single pole ChangeOver"/"Single pole Centre Off" type.

According an embodiment of the invention, the appliance is a laundry washing appliance, and the electric load is a washing heater configured for heating washing water during a washing process performed by the appliance.

According an embodiment of the invention, the appliance is a laundry drying appliance, and the electric load is a drying heater configured for heating drying air during a drying process performed by the appliance.

According an embodiment of the invention, the appliance is a laundry washing and drying appliance, the electric load is a washing heater configured for heating washing water during a washing process performed by the appliance, and the further electric load is a drying heater configured for heating drying air during a drying process performed by the appliance.

According an embodiment of the invention, the appliance is a dishwashing appliance.

Another aspect of the solution according to one or more embodiments of the invention relates to a method for determining faults in a circuit system of an appliance. The appliance comprises at least one electric load adapted to be energized by electrical coupling between first and second supply terminals of an electric power supply, at least two switching elements operable for coupling/decoupling the first and second supply terminals to/from first and second load terminals of the at least one electric load, and a control unit for operating the at least two switching elements. The method comprises, under the control of the control unit, conditioning the supply signal from the first supply terminal into at least one check signal having, for each configuration of the at least two switching elements, a respective predetermined trend, and determining, for each selected configuration of the at least two switching elements, faults in the circuit system based on matches/mismatches between an actual trend of at least one of the at least one check signal and the respective predetermined trend.

According to an embodiment of the invention, the at least one electric load comprises an electric load having first and second load terminals; the supply signal has an alternating full-wave periodic waveform; the at least two switching elements comprise first and second switching elements operable between closed/opened states for coupling/decoupling the first and second supply terminals to/from the first and second load terminals of the electric load, respectively; the at least one check signal comprises a first check signal; the at least one conditioning arrangement comprises a first conditioning arrangement having a first unidirectional signal flow element coupled between the first supply terminal and the second load terminal, and with the first and second switching elements in the opened-states the predetermined trend of the check signal has a half-wave periodic waveform. The method comprises determining a leakage between the electric load and the first supply terminal when, with the first and second switching elements in the opened-states, the actual trend of the check signal takes the full-wave periodic waveform.

According to an embodiment of the invention, the first conditioning arrangement further comprises a first impedance arrangement between the first load terminal and the control unit. With the first and second switching elements in the opened-states, the predetermined trend of the check signal has a predetermined peak value depending on sizing of the impedance arrangement. The method comprises determining a leakage between the electric load and the second supply terminal when, with the first and second switching elements in the opened-states, the actual trend of the check signal takes the half-wave periodic waveform with a peak value lower than said predetermined peak value by a predefined threshold amount.

According to an embodiment of the invention, the at least one check signal further comprises a second check signal, and the at least one conditioning arrangement further comprises a second conditioning arrangement for providing said second check signal. With the first and second switching elements in the opened-states, the predetermined trend of the check signal has a shifting voltage given by first impedance arrangement powering, and the predetermined trend of the second check signal has the half-wave periodic waveform according to supply signal passage across the first unidirectional signal flow element and the second conditioning arrangement. The method comprises determining a non-conductivity of the electric load when, with the first and second switching elements in the opened-states, the actual trend of the check signal takes a constant trend at said shifting voltage and the actual trend of the second check signal matches the respective predetermined trend.

According to an embodiment of the invention, the method further comprises determining an unwanted on-state of the second switching element when, with the first and second switching elements in the off-states, the actual trend of the check signal takes the constant trend at said shifting voltage and the actual trend of the second signal takes a constant trend at a reference voltage.

In accordance with aspects of the invention, a high number of faults are easily determined as soon as they take place, and in different circuit system configurations. This is achieved by means of few, low area occupation, basic components and of few elementary operations on proper electric signals.

BRIEF DESCRIPTION OF THE ANNEXED DRAWINGS

Figure 2:
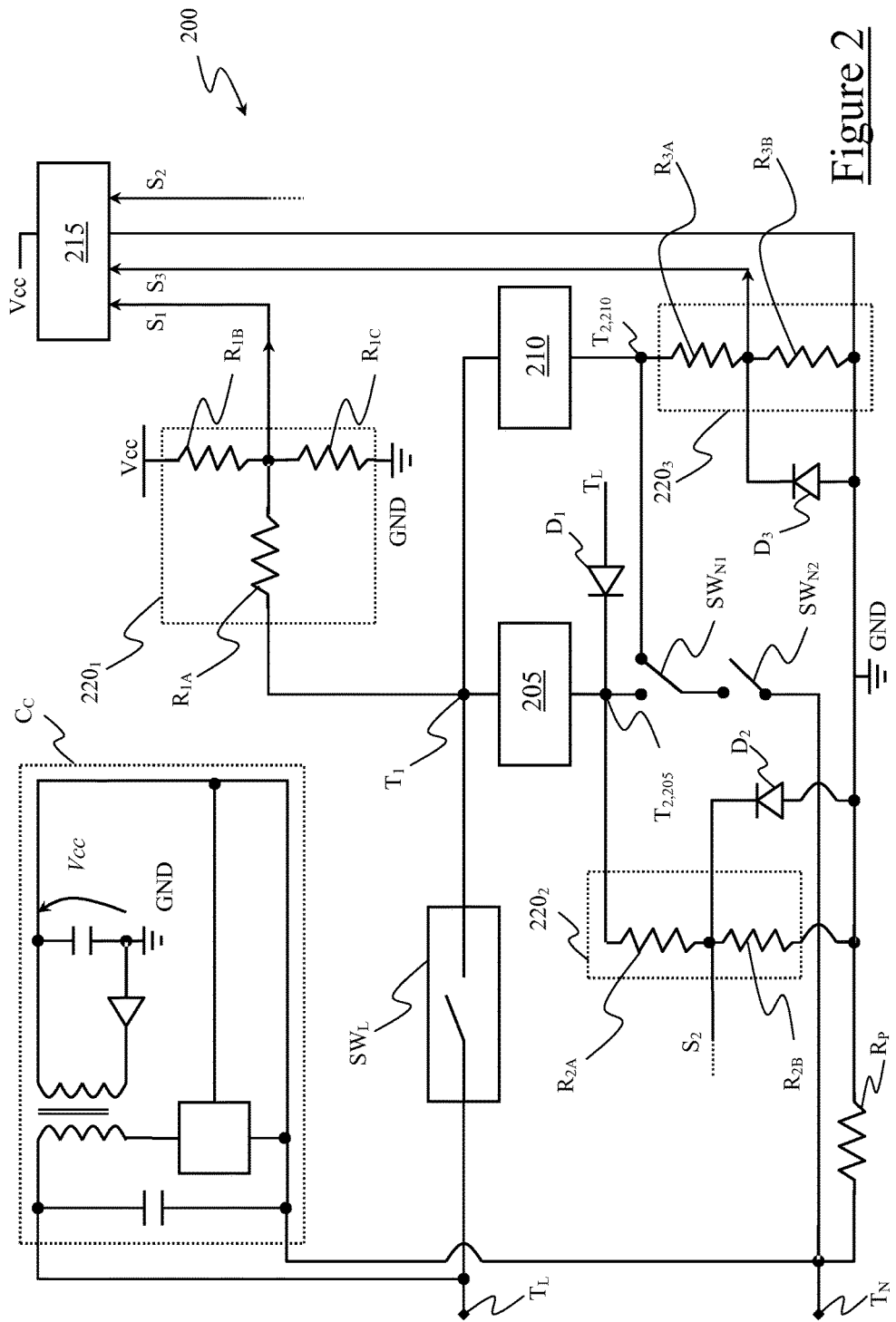
Figure 3A:
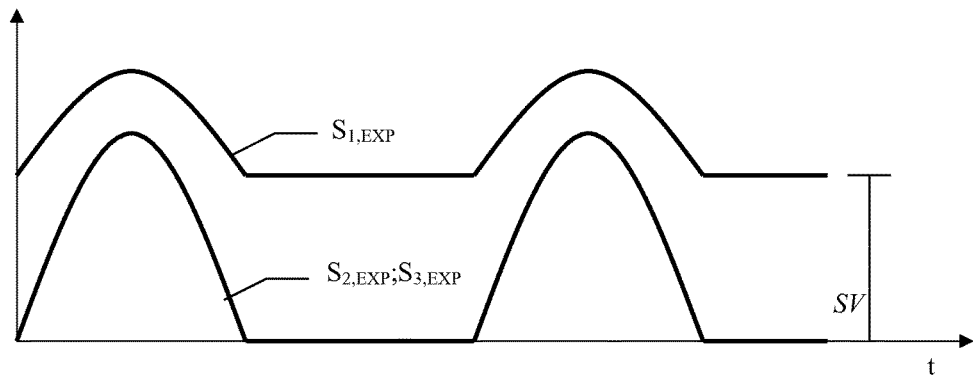
Figure 3B:
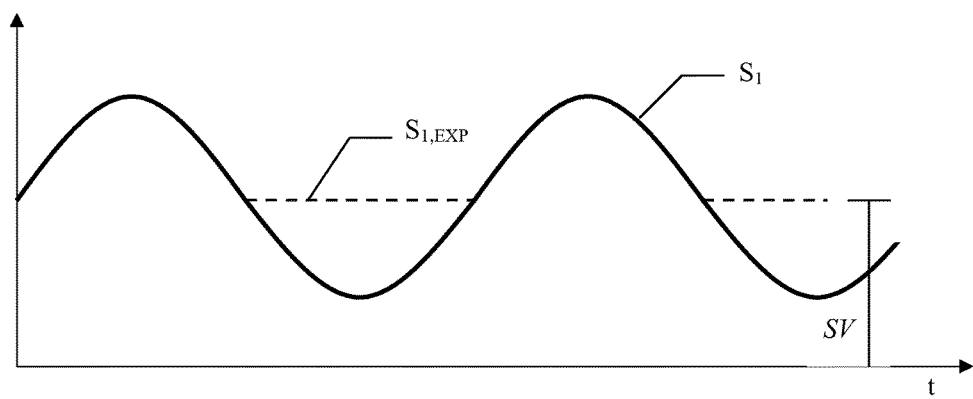
Figure 3C:
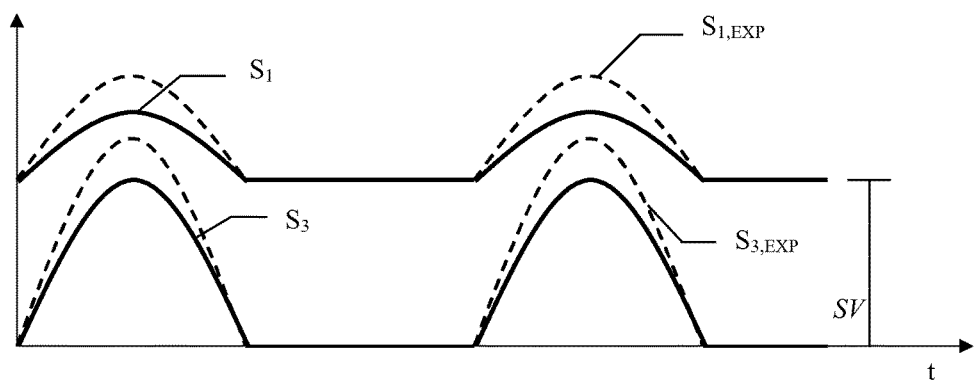
Figure 3D:
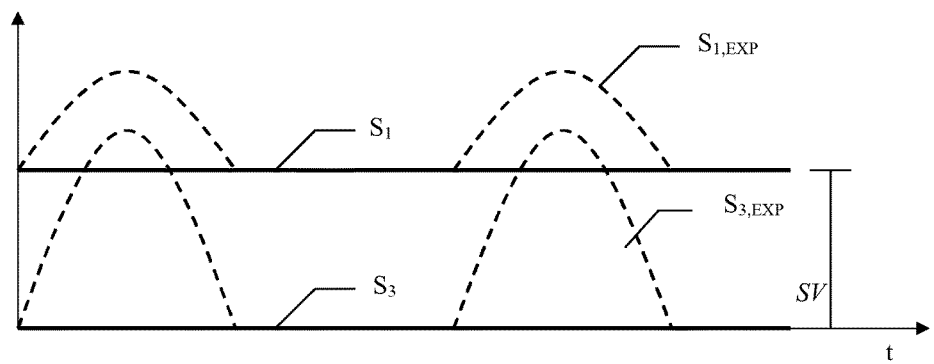
Figure 3E:
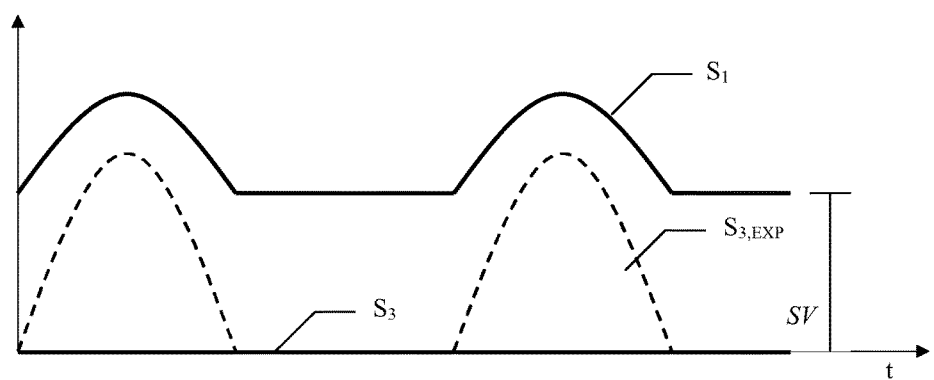
Figure 3F:
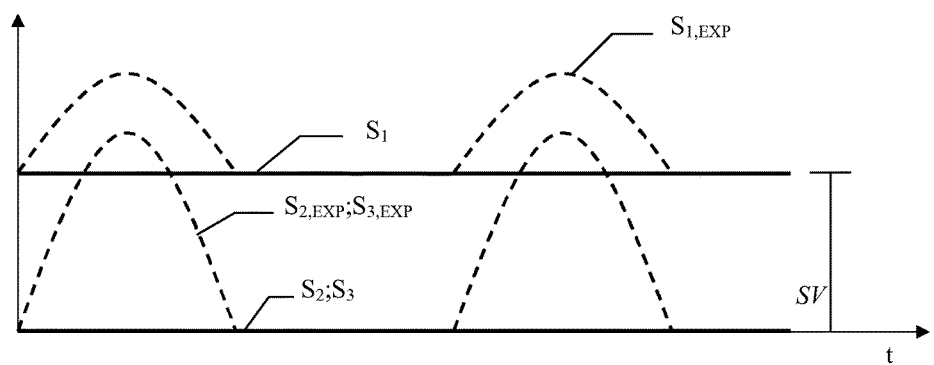
Figure 4A:
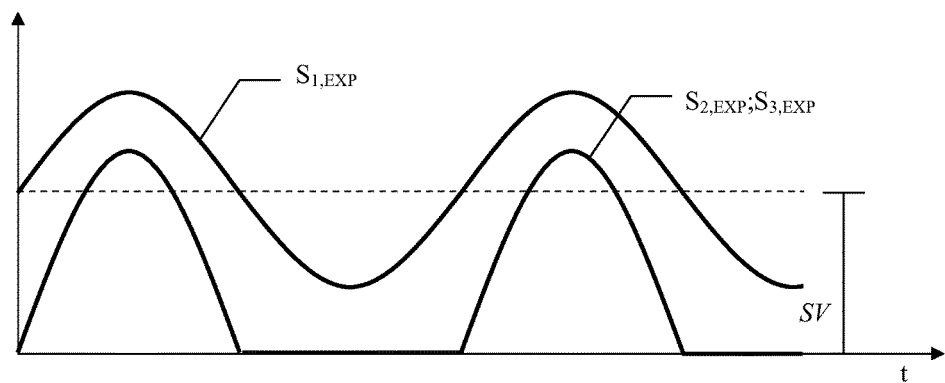
Figure 4B:
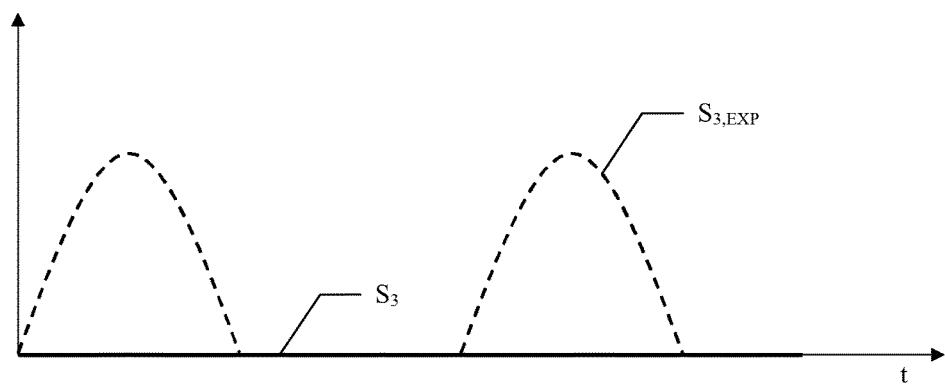
Figure 4C:
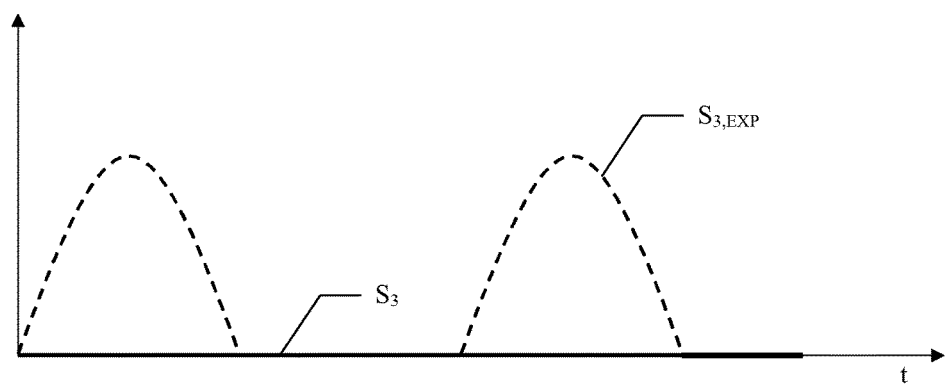
Figure 5A:
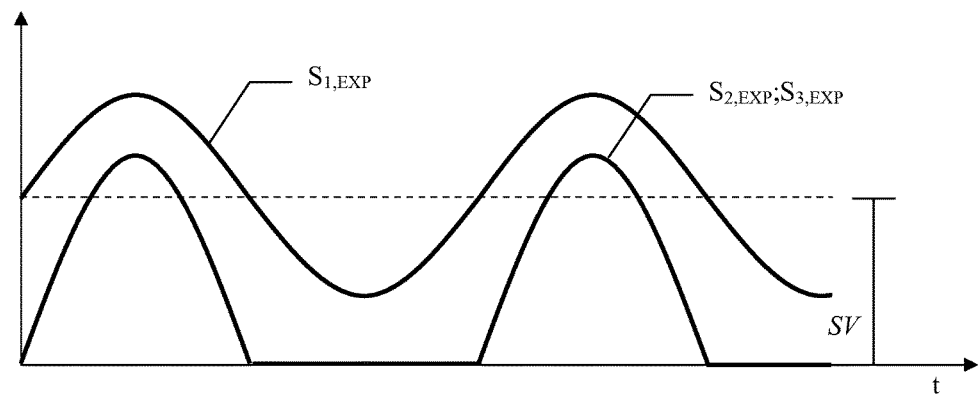
Figure 5B:
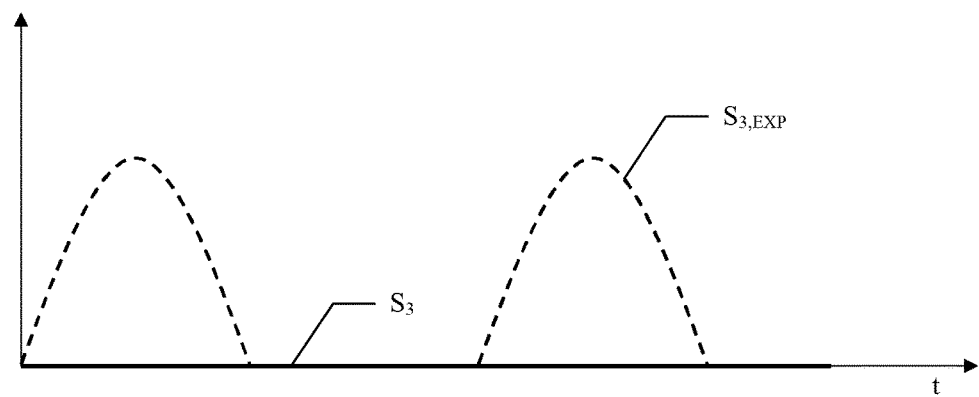
Figure 5C:
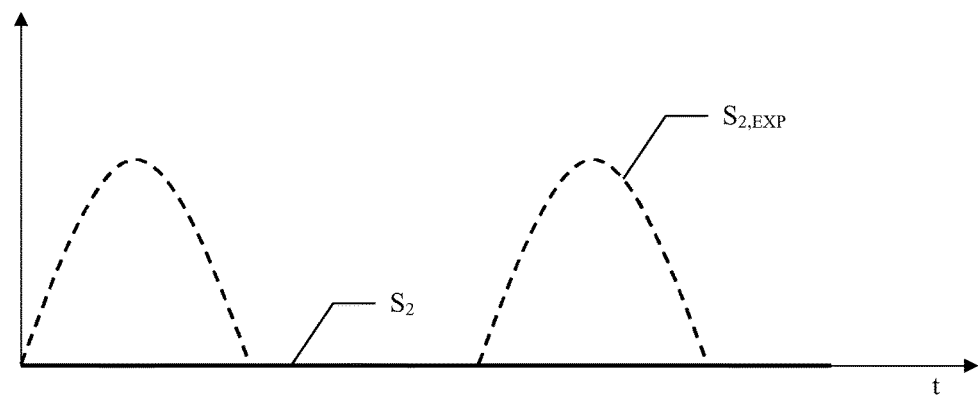
Figure 6A:
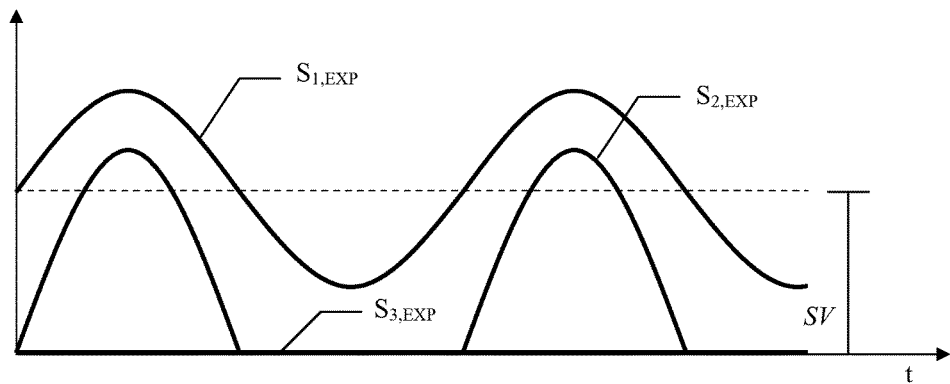
Figure 6B:
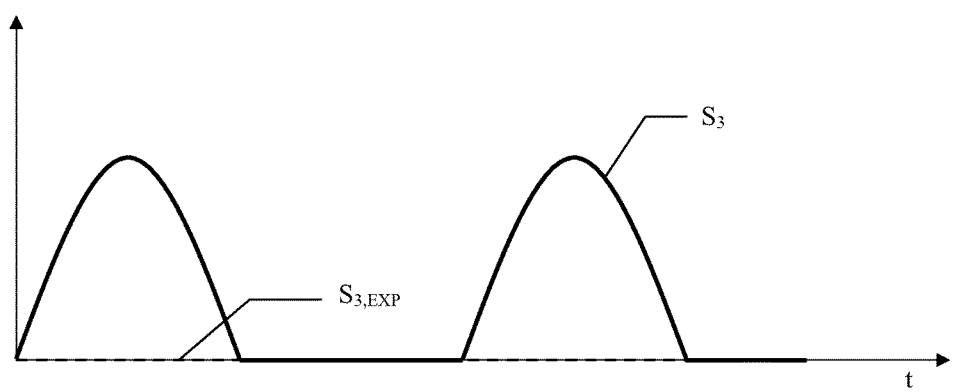
Figure 6C:
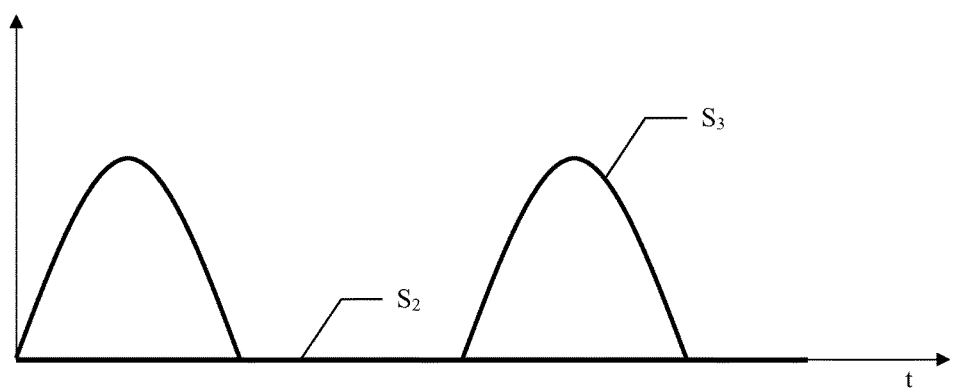

These and other features and advantages of the present invention will be made apparent by the following description of some exemplary and non limitative embodiments thereof; for its better intelligibility, the following description should be read making reference to the attached drawings, wherein:

FIG. 1 schematically shows an appliance wherein the solution according to one or more embodiments of the invention may be applied;

FIG. 2 schematically shows a portion of a circuit system of the appliance according to an embodiment of the invention, and FIGS. 3A and 3B-3F show, in a first circuit system configuration, qualitative courses or trends of check signals in absence of faults and of the same check signals in presence of faults, respectively, according to an embodiment of the invention, FIGS. 4A and 4B-4C show, in a second circuit system configuration, qualitative courses or trends of check signals in absence of faults and of the same check signals in presence of faults, respectively, according to an embodiment of the invention, FIGS. 5A and 5B-5C show, in a third circuit system configuration, qualitative courses or trends of check signals in absence of faults and of the same check signals in presence of faults, respectively, according to an embodiment of the invention, FIGS. 6A and 6B-6C show, in a fourth circuit system configuration, qualitative courses or trends of check signals in absence of faults and of the same check signals in presence of faults, respectively, according to an embodiment of the invention, and FIGS. 7A and 7B-7D show, in a fifth circuit system configuration, qualitative courses or trends of check signals in absence of faults and of the same check signals in presence of faults, respectively, according to an embodiment of the invention.

DETAILED DESCRIPTION OF PREFERRED EMBODIMENTS OF THE INVENTION

Referring now to the drawings, FIG. 1 schematically shows an appliance 100, for example for domestic use (i.e., a household appliance), wherein the solution according to one or more embodiments of the invention may be applied. The appliance 100 may for example be a laundry washing appliance intended to perform only laundry washing operations (i.e., without laundry drying operations), a laundry drying appliance intended to perform only laundry drying operations (i.e., without laundry washing operations), or a laundry washing/drying appliance intended to perform both laundry washing and laundry drying operations (as generically illustrated in the figure, and to which reference will be made in the following by way of a non-limiting example only). However, as will be best understood in the following, the principles of the invention may also apply to other washing and/or drying appliances (e.g., dishwashing appliances), as well as other appliances generally equipped with electronic, electro-hydraulic and/or electro-mechanical components prone to faults.

The appliance 100 preferably comprises a substantially parallelepiped-shaped cabinet 105, which encloses an inner compartment 110.

In the exemplarily considered appliance 100 (which is intended to perform both laundry washing and laundry drying operations), the inner compartment 110 accommodates a tub (not visible), adapted to be filled with washing water, and a e.g. rotatable perforated drum 115 mounted therein (in either a horizontal or vertical orientation) adapted to house the laundry to be treated (i.e., the laundry to be washed and/or dried, in the example at issue). Anyway, according to the considered appliance (and, hence, according to the items to be treated by it and according to the treatment the appliance is intended to perform on them), the inner compartment 110 may accommodate, instead of the tub and the rotatable perforated drum 115, any item treatment chamber (e.g., a rotatable, non-perforated drum in case of a laundry dryer, or two or more pull-out racks or baskets in case of a dishwasher, and the like). The inner compartment 110 is accessible through an access door 120 (shown in an opened condition) preferably provided on a front panel of the cabinet 105 for loading/unloading the laundry.

The inner compartment 110 also accommodates, not visible in such figure, a number of well-known electronic, electro-hydraulic and/or electro-mechanical components, which form (as a whole) a circuit system allowing operation of the appliance 100.

Hereinafter, reference will be also made to FIG. 2, which schematically shows a portion of a circuit system 200 according to an embodiment of the invention.

The circuit system 200 comprises one or more electric loads, such has the electric loads 205,210, allowing operation of the appliance 100.

The electric loads 205,210, schematically illustrated as generic blocks, are not limiting for the invention. Indeed, the principles of the invention apply to any electric load.

In the example at issue, the electric load 205, between load terminals $T_1, T_{2,205}$, is a washing heater (i.e. a resistive load configured to heat, when energized, washing water during a washing process performed by the appliance 100), whereas the electric load 210, between the load terminal $T_1$ and a further load terminal $T_{2,210}$, is a drying heater (i.e. a resistive load configured to heat, when energized, drying air during a drying process performed by the appliance 100).

The electric loads 205, 210 can be selectively coupled, for their energization, to line $T_L$ and neutral $T_N$ terminals of an electric power supply. In the example herein considered, the neutral terminal $T_N$ provides a reference signal, and the line terminal $T_L$ provides a supply signal $V_{SUPPLY}$ with respect to the reference signal. In the example at issue, the supply signal $V_{SUPPLY}$ is a 230V or 125V alternating voltage at a 50 Hz or 60 Hz frequency, having a full-wave periodic, e.g. sinusoidal, waveform.

A number of electrically-operated switching devices, or switches, can be provided for allowing such selective coupling.

A door switch $SW_L$ is provided between the line terminal $T_L$ and the load terminal $T_1$. The door switch $SW_L$ can be switched between an opened, or off, state decoupling line $T_L$ and load $T_1$ terminals from each other thereby preventing, in door-opened condition, energization of the electric loads 205,210 (and/or of any other electric loads downstream the door switch $SW_L$), and a closed, or on, state. When the door switch $SW_L$ is instead in the on state, electrical coupling of the line $T_L$ and load $T_1$ terminals to each other can be established, and/or mechanical lock of the door 120 can be commanded. As usual, such a mechanical lock is provided to prevent opening of the door 120 for safety reasons, e.g. when the electric load 205,210 is energized, when washing or rinsing water is provided within the tub, when a dangerous temperature in the inner compartment 110 is detected, or when the drum 115 is still rotating.

Switches $SW_{N1}, SW_{N2}$ are also provided for selectively coupling the load terminal $T_{2,205}$ or the load terminal $T_{2,210}$ to the neutral terminal $T_N$. In the example at issue, the switch $SW_{N1}$ is a two-way switch—for example, a SPDT ("Single Pole Double Throw"), or a SPCO ("Single pole Change-Over"/"Single pole Centre Off") switch—that can be switched between the load terminal $T_{2,205}$ and the load terminal $T_{2,210}$, whereas the switch $SW_{N2}$ is a on-off switch that can be switched between an opened, or off, state preventing electric coupling between the neutral terminal $T_N$ and the load terminal $T_{2,205}$ (or the terminal $T_{2,210}$, according to switch $SW_{N1}$ position), and a closed, or on, state allowing such electric coupling. However, in embodiments with a single electric load, not shown, a single on-off switch may be provided, whereas in embodiments with multiple (e.g., more than two) electric loads, not shown, multi-way switches may be provided.

The circuit system 200 also comprises an AC-DC conversion circuit (only conceptually illustrated in the figure and denoted, as a whole, by the reference $C_C$), comprising transforming, rectifying and regulating components for receiving the (AC) electric power supply (from line $T_L$ and neutral $T_N$ terminals) and providing one or more DC voltages, such as a reference, or ground voltage GND, and a voltage Vcc (e.g., a 3V, 5V or 12V DC voltage with respect to the ground voltage GND). As visible in the figure, the neutral terminal $T_N$ is preferably set at the voltage Vcc (so as to allow proper driving of power components, e.g. triacs, not shown).

For the sake of completeness, a parasitic resistor $R_P$ is also shown in the circuit system 200, intended to represent parasitic coupling between the neutral terminal $T_N$ and the terminal providing the ground voltage GND (hereinafter, ground terminal). Assuming a very high resistance value of the parasitic resistor $R_P$ (as actually is in practical implementations), it does not significantly impact on circuit system 200 operation (reason why, in the following, it will be considered as missing).

The circuit system 200 further comprises a control unit 215, for example a microcontroller/microprocessor, powered, for its operation, between upper and lower DC voltages—for example, between the voltage $V_{CC}$ and the reference voltage GND, respectively (connection between the control unit 215 and the AC-DC conversion circuit $C_C$ not shown).

Among other things, the control unit 215 is configured for switching on/off the switch $SW_L$ in door-closed/opened condition, respectively, and for selectively controlling the switches $SW_{N1}$,$SW_{N2}$ according to the electric load 205,210 to be energized for operating the appliance 100. In this respect, the switches $SW_L$,$SW_{N2}$ in the on-state and the switch $SW_{N1}$ switched towards the load terminal $T_{2,205}$ cause the electric load 205 to be energized by the supply signal $V_{SUPPLY}$ through it, whereas the switches $SW_L$,$SW_{N2}$ in the on-state and the switch $SW_{N1}$ switched towards the load terminal $T_{2,210}$ cause the electric load 210 to be energized by the supply signal $V_{SUPPLY}$ through it.

The control unit 215 is also configured for: receiving a check (e.g., voltage) signal $S_1$ (deriving from the supply signal $V_{SUPPLY}$, as discussed below); acquiring a course, i.e. time trend of the received check signal $S_1$; determining, in door-opened condition, faults in the circuit system 200 according to the acquired trend of the check signal $S_1$ (as better discussed in the following), and, upon faults determination, signaling an alert condition (possibly, by displaying a proper error code) and aborting the appliance operation.

In order to achieve that, according to the invention the circuit system 200 further comprises a signal conditioning arrangement $D_1$,$220_1$ for conditioning the supply signal $V_{SUPPLY}$ so as to obtain said check signal $S_1$. The conditioning arrangement $D_1$,$220_1$ is such that, in absence of faults in the circuit system 200, the check signal $S_1$ has a predetermined, or expected, trend $S_{1,EXP}$ deriving from supply signal $V_{SUPPLY}$ passage through a predetermined conductive path defined by (or comprising) the conditioning arrangement $D_1$,$220_1$ itself. Thus, any fault in the circuit system 200 that affects the predetermined conductive path also affects the trend of the check signal $S_1$ (with respect to the expected trend $S_{1,EXP}$). By taking advantage of such feature, the control unit 215 according to the invention is configured for determining a fault in the circuit system 200 based on a mismatch between the actual trend of the check signal $S_1$ and the respective expected trend $S_{1,EXP}$.

In its simplest, and preferred, embodiment, the respective expected trend $S_{1,EXP}$ is stored in a storage area, not shown, of the control unit 215.

Storing of the expected trend $S_{1,EXP}$ can be achieved during a manufacturing process of the appliance (e.g., as a result of a programming operation of the control unit 215), or after it (e.g., as a result of a preliminary acquiring operation performed by the control unit 215 on the check signal $S_1$ at a first start of the appliance, i.e. when the latter is supposed to operate correctly).

The acquisition of the trend of the check signal $S_1$ and of the expected trend $S_{1,EXP}$ is preferably performed by acquiring significant (discrete) values of the check signal $S_1$ (e.g., by means of sampling operations performed by the control unit 215 on the check signal $S_1$). According to the preferred embodiment herein considered, such significant values comprise interpolating values univocally identifying the trend of the check signal $S_1$. In the example herein considered wherein signals featuring periodic waveforms deriving from the supply signal $V_{SUPPLY}$ waveform are handled, such interpolating values comprise peak values of the check signal $S_1$ at each one of a predefined number of half-periods of the supply signal $V_{SUPPLY}$.

Back to the conditioning arrangement $D_1$,$220_1$, it may comprise any component/device/circuit able to properly change (e.g., partly cut) the trend of the supply signal $V_{SUPPLY}$ (so as to make the corresponding check signal $S_1$ sufficiently different, and hence distinguishable from it). Advantageously, the conditioning arrangement $D_1$,$220_1$ comprises any component/device/circuit able to cut (e.g., some of the) half-waves of the supply signal $V_{SUPPLY}$ (so that the corresponding check signal $S_1$ features a trend sufficiently different and distinguishable from the "full-wave" trend of the alternating supply signal $V_{SUPPLY}$ and from flat trends). Preferably, as herein assumed by way of example only, the conditioning arrangement $D_1$,$220_1$ comprises a unidirectional signal flow device $D_1$ coupled between the line $T_L$ and load $T_{2,205}$ terminals, and an impedance (e.g., resistive) arrangement $220_1$ coupled between the load terminal $T_1$ and the control unit 215. The unidirectional signal flow device $D_1$ may be any passive or active device suitable for the purpose—by passive device meaning any device that requires no control by the control unit 215 for its operation, and by active device meaning any device that requires a control by the control unit 215 for its operation. Preferably, the unidirectional signal flow device $D_1$ is a passive device, so that the circuit system 200 is simple and low cost, and easy to operate. As will be assumed hereinafter by way of example only, the unidirectional signal flow device $D_1$ is a diode. Alternatively, the unidirectional signal flow device $D_1$ may be any active device, for example any properly controlled device having switching properties (such as thyristors, triacs, transistors, not shown).

As will be made apparent from the following description, the diode $D_1$ provides a (e.g., voltage) signal at the load terminal $T_1$ (hereinafter, signal $S_1$) having a different waveform than the supply signal $V_{SUPPLY}$ waveform (i.e., lacking of the negative or positive half-waves, according to diode $D_1$ direction), whereas the resistive arrangement $220_1$ provides the check signal $S_1$ from the signal $S_1^*$, such that the check signal $S_1$ can be correctly read by the control unit 215.

The resistive arrangement $220_1$ may be un-powered (i.e. with no DC biasing across it), being for example a divider resistive path between the load terminal $T_1$ and the ground terminal. This provides a scaling of the signal $S_1^*$, namely it produces an output signal (i.e., the check signal $S_1$) that is a fraction of its input signal (i.e., the signal $S_1^*$). Thanks to scaling, the check signal $S_1$ can be received by the control unit 215 without trends distortions (e.g. clamping or cutting).

Advantageously, as assumed hereinafter, the resistive arrangement $220_1$ is powered, i.e. a DC biasing is provided across it. The DC biasing across the resistive arrangement $220_1$ sums to the DC component of the signal $S_1^*$ (that, as a result of the exemplary circuit arrangement, is at the ground voltage GND). This provides, in addition to scaling, a shifting of the signal $S_1^*$, namely a moving thereof from a level (i.e., the ground voltage GND) to another one (depending on DC biasing and resistive arrangement $220_1$ sizing, as discussed below). As will be made apparent from the following description, providing both scaling and shifting of the signal $S_1^*$ introduces (with respect to only scaling thereof) a further type of trend (e.g., a shifted half/full-wave alternating trend that, being shifted with respect to the ground voltage GND, is different and distinguishable from the half/full waves alternating trend referred to the ground voltage GND, and from the flat trends) that allows detecting/distinguishing a higher number of faults.

In the example at issue, the resistive arrangement $220_1$ is advantageously powered between the voltage $V_{CC}$ and the ground voltage GND (as discussed below), and comprises three resistors $R_{1A}$, $R_{1B}$ and $R_{1C}$ (whose resistances will be denoted hereinafter by $R_{1A}$, $R_{1B}$ and $R_{1C}$, respectively). A first terminal of the resistor $R_{1A}$ is coupled (e.g., directly connected) to the load terminal $T_1$ for receiving the signal $S_1^*$, a second terminal of the resistor $R_{1A}$ is coupled (e.g., directly connected) to first terminals of the resistors $R_{1B}$ and $R_{1C}$, whereas the second terminals of the resistors $R_{1B}$ and $R_{1C}$ receive the voltage $V_{CC}$ and the ground voltage GND, respectively.

By virtue of such implementation, the check signal $S_1$ is, with respect to the reference voltage, shifted by a shifting amount, e.g. a shifting voltage SV, given by biasing of the resistive arrangement $220_1$ $$\left(\text{i.e., } SV = V_{CC} * \frac{R_{1C}}{R_{1B}+R_{1C}}\right),$$

and, with respect to the signal $S_1^*$ (and hence with respect to the supply signal $V_{SUPPLY}$), scaled by a scaling factor $SF_1$ depending on the equivalent resistance of the resistive arrangement $220_1$ $$\left(\text{i.e., } SF_1 = \frac{R_{1B} // R_{1C}}{R_{1A}+(R_{1B} // R_{1C})}\right).$$

Powering the resistive arrangement $220_1$ between same voltages as the control unit 215 (in the example at issue, between the same voltages provided by the conversion circuit $C_C$, i.e., the voltage $V_{CC}$ and the ground voltage GND) makes resistances $R_{1A}, R_{1B}, R_{1C}$ sizing (for the correct reading of the check signal $S_1$ by the control unit 215) particularly simple. Indeed, by sizing $R_{1B}=R_{1C}$, the shifting voltage SV is advantageously set at half-swing between the upper voltage $V_{CC}$ and the reference voltage (i.e., the operation swing of the control unit 215), and, by sizing $R_{1A}$ sufficiently higher than $R_{1B}/R_{1C}$, the scaling factor $SF_1$ is advantageously set low enough to allow the check signal $S_1$ (i.e., any negative and any positive half-waves thereof) to completely fall within the operation swing of the control unit 215.

By way of example only, $$\begin{cases} R_{1A} = 243 \text{ K}\Omega \\ R_{1B} = R_{1C} = 7.5 \text{ K}\Omega \end{cases}$$

Preferably, although not necessarily, the circuit system 200 further comprises one or more, e.g. two, further signal conditioning arrangements $D_2, 220_2$ and $D_3, 220_3$ for conditioning the supply signal $V_{SUPPLY}$ into further check signals $S_2$ and $S_3$, respectively. As discussed above for the check signal $S_1$, the check signals $S_2$ and $S_3$ have respective expected trends $S_{2,EXP}$ and $S_{3,EXP}$, deriving from supply signal $V_{SUPPLY}$ passage through respective predetermined conductive paths defined by (or comprising) the conditioning arrangements $D_2, 220_2$ and $D_3, 220_3$ themselves. As better discussed below, in door-opened condition the check signals $S_2$ and $S_3$ derive from passage of the supply signal $V_{SUPPLY}$ (at the line terminal $T_L$) through the diode $D_1$ and the conditioning arrangement $D_2, 220_2$, and through the diode $D_1$, the electric loads 205,210 and the conditioning arrangement $D_3, 220_3$, respectively. Instead, in door-closed condition, the check signals $S_2$ and $S_3$ derive from passage of the supply signal $V_{SUPPLY}$ (at the line terminal $T_L$) through the electric load 205 and the conditioning arrangement $D_2, 220_2$, and through the electric load 210 and the conditioning arrangement $D_3, 220_3$, respectively, being the diode $D_1$ short-circuited by the supply signal $V_{SUPPLY}$ at both its cathode and anode terminals.

The control unit 215 is preferably configured for acquiring also the trend of the check signals $S_2$ and $S_3$ and of the expected trends $S_{2,EXP}$ and $S_{3,EXP}$, for example by acquiring the peak values thereof (as discussed above).

As will be best understood by the following description, the control unit 215 is also configured for determining matches/mismatches between the trends of the check signals $S_2$ and $S_3$ and the expected trends $S_{2,EXP}$ and $S_{3,EXP}$, and, according to that, for distinguishing fault causes in door-opened condition and for determining faults in the circuit system 200 in door-closed condition.

The conditioning arrangements $D_2, 220_2$ and $D_3, 220_3$ comprise, in the example at issue, respective impedance (e.g., resistive) arrangements $220_2$ and $220_3$ and respective unidirectional signal flow devices $D_2$ and $D_3$ (e.g., diodes).

The resistive arrangement $220_2$, comprises, in the example at issue, two resistors $R_{2A}$ and $R_{2B}$ (whose resistances will be denoted hereinafter by $R_{2A}$, and $R_{2B}$, respectively). A first terminal of the resistor $R_{2A}$ is coupled (e.g., directly connected) to the load terminal $T_{2,205}$, a second terminal of the resistor $R_{2A}$ is coupled (e.g., directly connected) to a first terminal of the resistors $R_{2B}$ and provides the check signal $S_2$, whereas the second terminal of the resistors $R_{2B}$ receives the reference voltage. Assuming (as actually is in practical implementations) the electric load 205 resistance negligible, the check signal $S_2$ is, with respect to the signal $S_1*$, scaled by a scaling factor $SF_2$ depending on the equivalent resistance of the resistive arrangement $220_2$ $$\left(i.e., SF_2 = \frac{R_{2B}}{R_{2A} + R_{2B}}\right).$$

The resistive arrangement $220_3$ comprises, in the example at issue, two resistors $R_{3A}$ and $R_{3B}$ (whose resistances will be denoted hereinafter by $R_{3A}$, and $R_{3B}$, respectively). A first terminal of the resistor $R_{3A}$ is coupled (e.g., directly connected) to the load terminal $T_{2,210}$, a second terminal of the resistor $R_{3A}$ is coupled (e.g., directly connected) to a first terminal of the resistor $R_{3B}$ and provides the check signal $S_3$, whereas a second terminal of the resistors $R_{3B}$ receives the reference voltage. Assuming (as actually is in practical implementations) the electric load 210 resistance negligible, the check signal $S_3$ is, with respect to the signal $S_1*$, scaled by a scaling factor $SF_3$ depending on the equivalent resistance of the third resistive arrangement $220_3$ $$\left(i.e., SF_3 = \frac{R_{3B}}{R_{3A} + R_{3B}}\right).$$

Similarly to the above, a proper sizing of the resistances $R_{2A},R_{2B}$ and $R_{3A},R_{3B}$, not limiting for the invention, allows the check signals $S_2$ and $S_3$ to be correctly read by the control unit 215. For example, by sizing $R_{2B}$ and $R_{3B}$ sufficiently higher than $R_{2A}$ and $R_{3A}$, respectively, the scaling factors $SF_2$ and $SF_3$ are advantageously set low enough to allow the check signals $S_2,S_3$ to completely fall within the operation swing of the control unit 215.

By way of example only, $$\begin{cases} R_{2B} = R_{3B} = 243 \text{ K}\Omega \\ R_{2A} = R_{3A} = 10 \text{ K}\Omega \end{cases}$$

In the disclosed embodiment, the resistive arrangements $220_2,220_3$ are designed to provide no shifting with respect to the reference voltage. Indeed, as will be understood when discussing faults scenarios, shifted check signals $S_2$ and $S_3$ are not significant in faults determination for the purposes of the invention. However, the possibility of shifting of the check signals $S_2,S_3$ (e.g., my means of resistive arrangements similar to the resistive arrangement $220_1$) is not excluded.

The diodes $D_2$ and $D_3$ are coupled (e.g., directly connected) in parallel to the resistors $R_{2B}$ and $R_{3B}$, respectively. As discussed below, thanks to the diodes $D_2$ and $D_3$, the check signals $S_2$ and $S_3$ properly fall within the operation swing of the control unit 215 (e.g., by cutting the negative half-waves of the supply signal $V_{SUPPLY}$). However, as discussed above for the conditioning arrangement $D_1,220_1$, the conditioning arrangements $D_2,220_2$ and $D_3,220_3$ may comprise any component/device/circuit able to properly change (e.g., partly cut) the trend of the supply signal $V_{SUPPLY}$ (so that the corresponding check signals $S_2$ and $S_3$ are sufficiently different, and hence distinguishable from it).

According to an embodiment, not shown, the diodes $D_2$ and $D_3$ may also be not provided (with the cutting effect that could be delegated to internal diodes which the control unit 215 is usually provided with). However, provision of the diodes $D_2$ and $D_3$ avoids electrically burdening of the control unit 215 (as the internal diodes are usually intended to protection of the control unit 215 from signals fluctuations), which in turns prevents breakage and increases reliability thereof.

Operation of the circuit system 200 being relevant for understanding the invention will be discussed now on.

Determination of circuit faults in switches $SW_L,SW_{N2}$, $SW_{N1}$ configurations having reference to door-opened condition will be firstly discussed. In this respect, all the check signals $S_1,S_2,S_3$ will be considered, it being understood that, when only one or some of the check signals $S_1,S_2,S_3$ are necessary for fault determination, the circuit portions of the circuit system 200 related to the unnecessary check signals $S_1,S_2,S_3$ could also be omitted (or used for other purposes).

FIG. 3A qualitatively shows, according to an embodiment of the invention, expected trends $S_{1,EXP},S_{2,EXP},S_{3,EXP}$ of the check signals $S_1,S_2,S_3$ in absence of faults, in the following switches $SW_L,SW_{N2},SW_{N1}$ configuration:
  switch $SW_L$ in the off-state,
  switch $SW_{N1}$ switched towards the load terminal $T_{2,205}$ (or, indifferently, towards the load terminal $T_{2,210}$), and
  switch $SW_{N2}$ in the off-state.

As illustrated, the expected trend $S_{1,EXP}$ takes a half-wave periodic waveform, deriving from passage, across the diode $D_1$, of the supply signal $V_{SUPPLY}$ at the line terminal $T_L$ (having the neutral terminal $T_N$ been assumed at, or substantially at, the ground voltage GND), lacking of the negative (as exemplary illustrated) or positive half-waves (according to diode $D_1$ direction). The half-wave periodic waveform is shifted, with respect to the ground voltage, by the shifting voltage SV (hereinafter, referred to as shifted half-wave periodic waveform), and scaled, with respect to the supply signal $V_{SUPPLY}$, by the scaling factor $SF_1$.

Unlike the expected trend $S_{1,EXP}$, the expected trend $S_{2,EXP},S_{3,EXP}$ takes a half-wave periodic waveform with no shifting with respect to the ground voltage (hereinafter, referred to as un-shifted half-wave periodic waveform). The un-shifted half-wave periodic waveform of the expected trend $S_{2,EXP},S_{3,EXP}$ is scaled, with respect to the supply signal $V_{SUPPLY}$, by the scaling factor $SF_2,SF_3$, respectively ($SF_2=SF_3$ in the example at issue).

In this switches $SW_L,SW_{N2},SW_{N1}$ configuration, five faults can be determined), discussed herebelow with reference to FIGS. 3B-3F—each figure qualitatively showing, according to an embodiment of the invention, the trends of only the check signals $S_1,S_2,S_3$ that, as matching/mismatching the respective expected trends $S_{1,EXP},S_{2,EXP},S_{3,EXP}$, are sufficient for fault determination.

Leakage towards line terminal $T_L$. As illustrated in FIG. 3B, in presence of a leakage between the electric load 205, or the electric load 210, and the line terminal $T_L$, the trend of the check signal $S_1$ takes the same full-wave periodic waveform as the supply signal $V_{SUPPLY}$ (diode $D_1$ bypassed), shifted by the shifting voltage SV, and scaled by the scaling factor $SF_1$. Thus, unlike the expected trend $S_{1,EXP}$, the trend of the check signal $S_1$ also features the negative half-waves.

Leakage towards neutral terminal $T_N$. As illustrated in FIG. 3C, in presence of a leakage between the electric load 205, or the electric load 210, and the neutral terminal $T_N$, the trends of the check signals $S_1,S_3$ differ from the respective expected trends $S_{1,EXP},S_{3,EXP}$ for lower peak values (depending on an equivalent leakage resistance, not shown, between the electric load 205, or the electric load 210, and the neutral terminal $T_N$). Only one check signal $S_1,S_3$ having the illustrated trend may be sufficient to determine such fault.

Electric load 205 electrically opened. As illustrated in FIG. 3D, in the event that the electric load 205 is not conductive (i.e., opened), no signal from the load terminal $T_{2,205}$ is passed to the load terminal $T_1$. Thus, the signal $S_1^*$ (not shown) takes a constant trend at the ground voltage GND. As a consequence, the trend of the check signal $S_1$ takes a constant trend at the shifting voltage SV, whereas the trend of the check signal $S_3$ takes the same constant trend at the ground voltage GND as the signal $S_1^*$.

Electric load 210 electrically opened. As illustrated in FIG. 3E, in the event that the electric load 210 is not conductive, no signal from the load terminal $T_1$ is passed to the load terminal $T_{2,210}$, thus the trend of the check signal $S_3$ takes the constant trend at the ground voltage. The trend of the check signal $S_1$ instead matches the expected trend $S_{1,EXP}$ (as the supply signal $V_{SUPPLY}$ passing through the diode $D_1$, the electric load 205 and the resistive arrangement $220_1$ as expected).

Switch $SW_{N2}$ off-state failure. Missing opening of the switch $SW_{N2}$ (i.e., switch $SW_{N2}$ still in the on-state) causes the switch $SW_{N2}$ to connect line $T_L$ and neutral $T_N$ terminals across the diode $D_1$ thereby bypassing the resistive arrangements $220_1$-$220_3$ (switch $SW_{N1}$ switched towards the load terminal $T_{2,2210}$) or both the electric loads 205,210 and the resistive arrangements $220_1$-$220_3$ (switch $SW_{N1}$ switched towards the load terminal $T_{2,205}$). Thus, the trend of the check signal $S_1$ takes the constant trend at the shifting voltage SV, whereas the trends of the check signals $S_2,S_3$ take the constant trend at the ground voltage GND.

The remaining switches $SW_L,SW_{N2},SW_{N1}$ configurations having reference to door-opened condition, namely:

switch $SW_L$ in the off-state
switch $SW_{N1}$ switched towards the load terminal $T_{2,205}$
switch $SW_{N2}$ in the on-state
switch $SW_L$ in the off-state
switch $SW_{N1}$ switched towards the load terminal $T_{2,210}$
switch $SW_{N2}$ in the on-state are not fully relevant for faults determination. Indeed, in such switches $SW_L,SW_{N2},SW_{N1}$ configurations, the expected trend $S_{1,EXP}$, and the expected trends $S_{2,EXP}$, $S_{3,EXP}$—featuring (as for FIG. 3F discussion) the constant trend at the shifting voltage SV and the constant trend at the ground voltage GND, respectively—are substantially unaffected by the most of the above-discussed faults. As should be readily verified, in such switches $SW_L,SW_{N2},SW_{N1}$ configurations, switch $SW_{N2}$ closing failure can still be determined if the trends of the check signals $S_1,S_2,S_3$ are similar to the expected trends $S_{1,EXP},S_{2,EXP},S_{3,EXP}$ of FIG. 3A.

Determination of faults in switches $SW_L,SW_{N2},SW_{N1}$ configurations having reference to door-closed condition will be discussed now on from FIG. 4A to FIG. 7D.

FIG. 4A qualitatively shows, according to an embodiment of the invention, expected trends $S_{1,EXP},S_{2,EXP},S_{3,EXP}$ of the check signals $S_1,S_2,S_3$ in absence of faults, in the following switches $SW_L,SW_{N2},SW_{N1}$ configuration:

switch $SW_L$ in the on-state,
switch $SW_{N1}$ switched towards the load terminal $T_{2,210}$, and
switch $SW_{N2}$ in the off-state.

As illustrated, the expected trend $S_{1,EXP}$ takes the same full-wave periodic waveform as the supply signal $V_{SUPPLY}$ (line terminal $T_L$/load terminal $T_1$ coupling enabled), shifted, with respect to the ground voltage, by the shifting voltage SV and scaled, with respect to the supply signal $V_{SUPPLY}$, by the scaling factor $SF_1$.

The expected trends $S_{2,EXP},S_{3,EXP}$ instead take the unshifted half-wave periodic waveform, scaled by the scaling factor $SF_2,SF_3$, respectively. Unlike the expected trends $S_{2,EXP},S_{3,EXP}$ illustrated in FIG. 3A, wherein negative halfwaves cutting is achieved by diode $D_1$ effect, in the present switches $SW_L,SW_{N2},SW_{N1}$ configuration the diode $D_1$ is bypassed (as the supply signal $V_{SUPPLY}$ being across both its cathode and anode terminals), and the cutting effect is now achieved by diodes $D_2$ and $D_3$ effects.

In this switches $SW_L,SW_{N2},SW_{N1}$ configuration, two faults can be determined, discussed herebelow with reference to FIGS. 4B-4C—each figure qualitatively showing, according to an embodiment of the invention, the trends of only the check signals $S_1,S_2,S_3$ that, as matching/mismatching the respective expected trends $S_{1,EXP},S_{2,EXP},S_{3,EXP}$, are sufficient for fault determination.

Electric load 210 electrically opened. In the event that the electric load 210 is not conductive, no signal $S_1^*$ from the load terminal $T_1$ (which is kept at the supply signal $V_{SUPPLY}$ by virtue of direct connection thereof with the line terminal $T_L$) is passed to the load terminal $T_{2,210}$. Thus, the trend of the check signal $S_3$ takes the constant trend at the ground voltage GND (as illustrated in FIG. 4B), whereas the trends of the check signals $S_1,S_2$ match the expected trends $S_{1,EXP},S_{2,EXP}$, respectively.

Switch $SW_{N2}$ off-state failure. Missing opening of the switch $SW_{N2}$ causes the switch $SW_{N2}$ to connect line $T_L$ and neutral $T_N$ terminals across the diode $D_1$ thereby bypassing it. Thus, as illustrated in FIG. 4C, the trend of the check signal $S_3$ takes the constant trend at the ground voltage GND (due to direct connection between the neutral terminal $T_N$ and the load terminal $T_{2,210}$). The trends of the check signals $S_1,S_2$ instead match the expected trends $S_{1,EXP},S_{2,EXP}$, respectively (as the signal $S_1^*$, at the supply signal $V_{SUPPLY}$, flows both in the resistive arrangement $220_1$ and in the conditioning arrangement $220_2$,D2).

FIG. 5A qualitatively shows, according to an embodiment of the invention, expected trends $S_{1,EXP},S_{2,EXP},S_{3,EXP}$ of the check signals $S_1,S_2,S_3$ in absence of faults, in the following switches $SW_L,SW_{N2},SW_{N1}$ configuration:

switch $SW_L$ in the on-state,
switch $SW_{N1}$ switched towards the load terminal $T_{2,205}$, and
switch $SW_{N2}$ in the off-state.

As illustrated, the expected trends $S_{1,EXP},S_{2,EXP},S_{3,EXP}$ are the same as FIG. 4A (whose explanation, as based on analogous considerations, is not repeated for the sake of conciseness).

In this switches $SW_L,SW_{N2},SW_{N1}$ configuration, two faults can be determined, discussed herebelow with reference to FIGS. 5B-5C—each figure qualitatively showing, according to an embodiment of the invention, the trends of only the check signals $S_1,S_2,S_3$ that, as matching/mismatching the respective expected trends $S_{1,EXP},S_{2,EXP},S_{3,EXP}$, are sufficient for fault determination.

Electric load 210 electrically opened. In the event that the electric load 210 is not conductive, no signal $S_1^*$ from the load terminal $T_1$ (which is kept at the supply signal $V_{SUPPLY}$ by virtue of direct connection thereof with the line terminal $T_L$) is passed to the load terminal $T_{2,210}$.

Thus, the trend of the check signal $S_3$ takes the constant trend at the ground voltage GND (as illustrated in FIG. 5B), whereas the trends of the check signals $S_1,S_2$ match the expected trends $S_{1,EXP},S_{2,EXP}$, respectively.

Switch $SW_{N2}$ off-state failure. Missing opening of the switch $SW_{N2}$ causes the switch $SW_{N2}$ to connect line $T_L$ and neutral $T_N$ terminals across the diode $D_1$, thereby bypassing it. As illustrated in FIG. 5C, the trend of the check signal $S_2$ takes the constant trend at the ground voltage GND (due to coupling between the neutral terminal $T_N$ and the resistive arrangement $220_2$). The trends of the check signals $S_1,S_3$ instead match the expected trends $S_{1,EXP},S_{3,EXP}$, respectively (as the signal $S_1^*$, at the supply signal $V_{SUPPLY}$, flows both in the resistive arrangement $220_1$ and in the conditioning arrangement $220_3,D_3$).

FIG. 6A qualitatively shows, according to an embodiment of the invention, expected trends $S_{1,EXP},S_{2,EXP},S_{3,EXP}$ of the check signals $S_1,S_2,S_3$ in absence of faults, in the following switches $SW_L,SW_{N2},SW_{N1}$ configuration:
switch $SW_L$ in the on-state,
switch $SW_{N1}$ switched towards the load terminal $T_{2,210}$, and
switch $SW_{N2}$ in the on-state.

As illustrated, the expected trends $S_{1,EXP},S_{2,EXP}$ are the same as FIGS. 4A and 5A (for analogous reasons). The expected trend $S_{3,EXP}$ instead takes the constant trend at the ground voltage GND, due to coupling between the neutral terminal $T_N$ and the conditioning arrangement $220_3,D_3$.

In this switches $SW_L,SW_{N2},SW_{N1}$ configuration, two faults can be determined, discussed herebelow with reference to FIGS. 6B-6C—each figure qualitatively showing, according to an embodiment of the invention, the trends of only the check signals $S_1,S_2,S_3$ that, as matching/mismatching the respective expected trends $S_{1,EXP},S_{2,EXP},S_{3,EXP}$, are sufficient for fault determination.

Switch $SW_{N2}$ on-state failure. Missing closing of the switch $SW_{N2}$ causes the switch $SW_{N2}$ to electrically decouple the neutral terminal $T_N$ and the conditioning arrangement $220_3,D_3$ from each other. Thus, the trends of the check signals $S_1,S_2$ match the expected trends $S_{1,EXP},S_{2,EXP}$ (as being unaffected by such fault), whereas, as illustrated in FIG. 6B, the trend of the check signal $S_3$ takes the un-shifted half-wave periodic waveform (as the check signal $S_3$ experiencing the same, or similar, conductive path as the check signal $S_2$).

Switch $SW_{N1}$ glue switched towards the load terminal $T_{2,205}$. Switch $SW_{N1}$ failure in switching towards the load terminal $T_{2,210}$ (i.e., switch $SW_{N1}$ still switched towards the load terminal $T_{2,205}$) causes the switch $SW_{N1}$ to electrically couple the neutral terminal $T_N$ and the conditioning arrangement $220_2,D_2$ to each other. Thus, as illustrated in FIG. 6C, the trend of the check signal $S_2$ takes the constant trend at the ground voltage GND, whereas the trend of the check signal $S_3$ takes the un-shifted half-wave periodic waveform (as the signal $S_1^*$ flowing through the conditioning arrangement $220_3,D_3$).

Figure 7A:
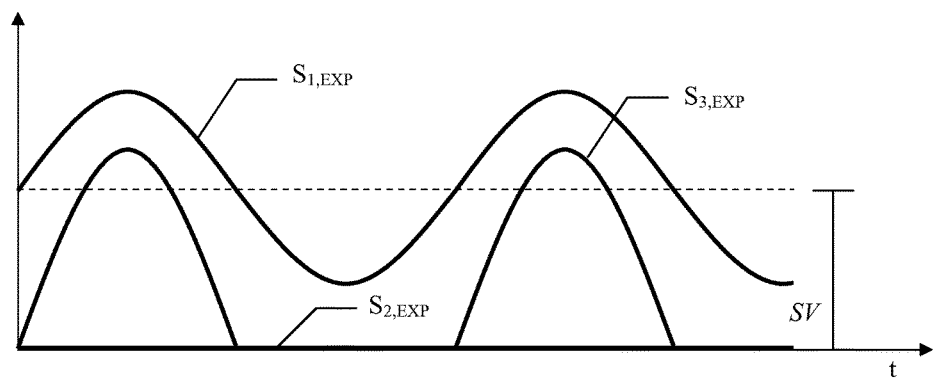

FIG. 7A qualitatively shows, according to an embodiment of the invention, expected trends $S_{1,EXP},S_{2,EXP},S_{3,EXP}$ of the check signals $S_1,S_2,S_3$ in absence of faults, in the following switches $SW_L,SW_{N2},SW_m$ configuration:
switch $SW_L$ in the on-state,
switch $SW_{N1}$ switched towards the load terminal $T_{2,205}$, and
switch $SW_{N2}$ in the on-state.

As illustrated, the expected trend $S_{1,EXP}$ is the same as FIG. 6A (whose explanation, as based on analogous considerations, is not repeated for the sake of conciseness). The expected trend $S_{2,EXP}$ instead takes the constant trend at the ground voltage GND (due to coupling between the neutral terminal $T_N$ and the conditioning arrangement $220_2,D_2$), whereas the expected trend $S_{3,EXP}$ takes the un-shifted half-wave periodic waveform (as the signal $S_1^*$ flowing through the conditioning arrangement $220_3,D_3$).

Figure 7B:
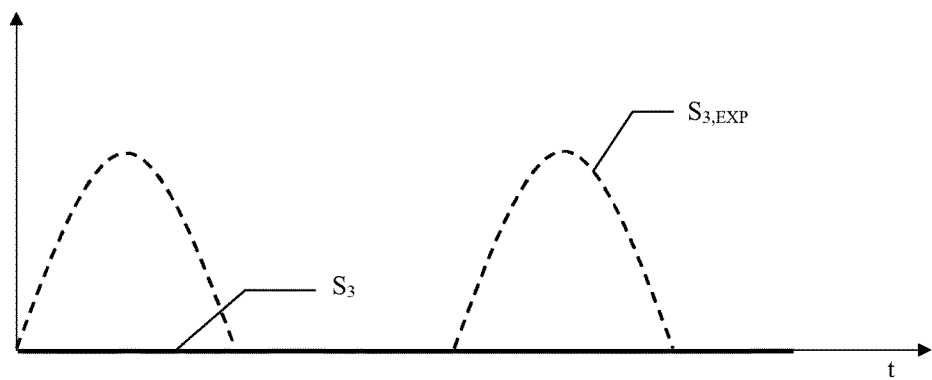
Figure 7C:
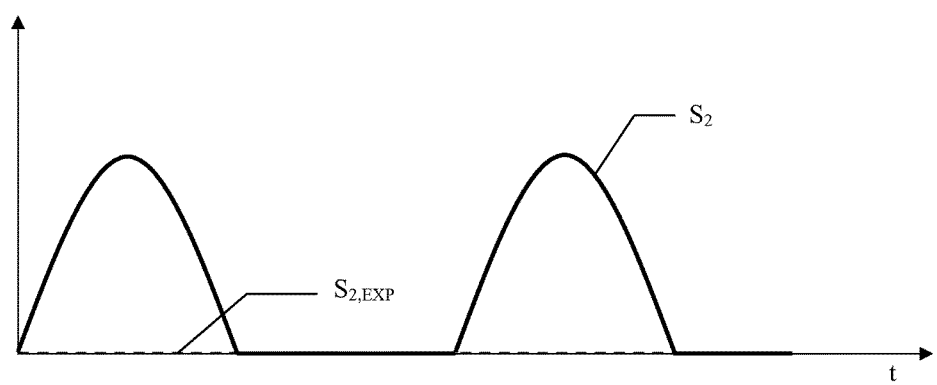

In this switches $SW_L,SW_{N2},SW_{N1}$ configuration, three faults can be determined, discussed herebelow with reference to FIGS. 7B-7C—each figure qualitatively showing, according to an embodiment of the invention, the trends of only the check signals $S_1,S_2,S_3$ that, as matching/mismatching the respective expected trends $S_{1,EXP},S_{2,EXP},S_{3,EXP}$, are sufficient for fault determination.

Electric load 210 electrically opened. In the event that the electric load 210 is not conductive, no signal $S_1^*$ from the load terminal $T_1$ (which is kept at the supply signal $V_{SUPPLY}$ by virtue of direct connection thereof with the line terminal $T_L$) is passed to the load terminal $T_{2,210}$. Thus, as illustrated in FIG. 7B, the trend of the check signal $S_3$ takes the constant trend at the ground voltage GND. The trends of the check signals $S_1,S_2$ instead match the expected trends $S_{1,EXP},S_{2,EXP}$, respectively.

Switch $SW_{N2}$ on-state failure. Missing closing of the switch $SW_{N2}$ causes the switch $SW_{N2}$ to electrically decouple the neutral terminal $T_N$ and the conditioning arrangement $220_2,D_2$ from each other. Thus, the trends of the check signals $S_1,S_3$ match the expected trend $S_{1,EXP},S_{3,EXP}$ (as the check signals $S_1,S_3$ being unaffected by such fault), whereas, as illustrated in FIG. 7C, the trend of the check signal $S_2$ takes the un-shifted half-wave periodic waveform (as the check signal $S_2$ experiencing the same, or similar, conductive path as the check signal $S_3$).

Figure 7D:
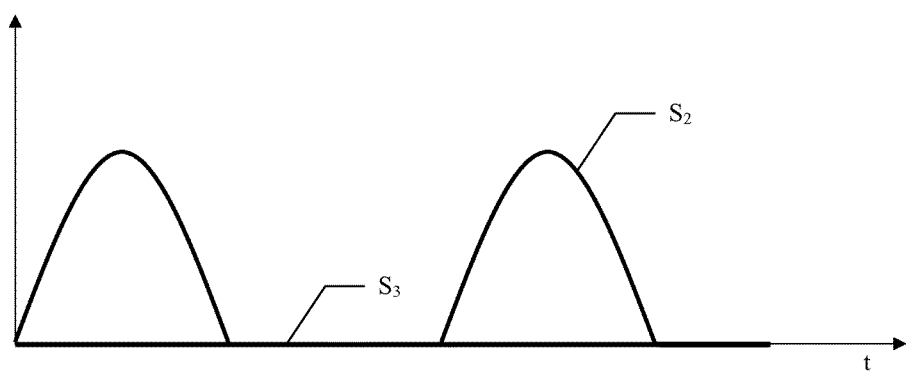

Switch $SW_{N1}$ glue switched towards the load terminal $T_2$. Switch $SW_{N1}$ failure in switching towards the load terminal $T_{2,210}$ (i.e., switch $SW_{N1}$ still switched towards the load terminal $T_{2,205}$) causes the switch $SW_{N1}$ to electrically couple the neutral terminal $T_N$ and the conditioning arrangement $220_3,D_3$ to each other. Thus, as illustrated in FIG. 7D, the trend of the check signal $S_3$ takes the constant trend at the ground voltage GND, whereas the trend of the check signal $S_2$ takes the un-shifted half-wave periodic waveform (as the signal $S_1^*$ flowing through the conditioning arrangement $220_2,D_2$).

Naturally, in order to satisfy local and specific requirements, a person skilled in the art may apply to the solution described above many logical and/or physical modifications and alterations. More specifically, although the invention has been described with a certain degree of particularity with reference to preferred embodiments thereof, it should be understood that various omissions, substitutions and changes in the form and details as well as other embodiments are possible. In particular, different embodiments of the invention may even be practiced without the specific details (such as the numeric examples) set forth in the preceding description for providing a more thorough understanding thereof; on the contrary, well known features may have been omitted or simplified in order not to obscure the description with unnecessary particulars.

As should be readily apparent by any man skilled in the art, in case that, in a given switches $SW_L,SW_{N2},SW_{N1}$ configuration, the trends of the check signals $S_1,S_2,S_3$ do not allow distinguishing the fault cause (as for FIGS. 3B-3C, wherein the electric load 205 and/or the electric load 210 may be affected by leakages towards line $T_L$ or neutral $T_N$ terminals), or can be associated with different faults (as for FIGS. 4B-4C, wherein both "electric load 210 electrically opened" and "switch $SW_{N2}$ off-state failure" fault conditions are possible), further operations can be performed—e.g., detection and analysis of additional check signals, or transient analysis of the check signals $S_1, S_2, S_3$ (and/or of the additional check signals, if provided).

As should be readily understood, detection of the check signals $S_1, S_2, S_3$ can be implemented in any useful way, also depending on the check signals $S_1, S_2, S_3$ to be detected. Indeed, the check signals $S_1, S_2, S_3$ may comprise voltage signals (as exemplarily described in the present description), and/or current signals. In the latter case, current mirrors for taking such currents signals and properly processing them can also be provided within the control unit 215 (or external thereto).

Moreover, the supply signal $V_{SUPPLY}$ may have any suitable periodic waveform instead of the full-wave sinusoidal waveform assumed by way of example only in the present description.

Finally, although in the present description explicit reference has been made to washing 205 and/or drying 210 electric loads, this should not be construed limitatively. Indeed, the principles of the invention for determination of faults in the circuit system 200 also apply to other electric loads, such as electric motors for causing drum rotation, electro-hydraulic components (such as valves for causing treatment fluids to be loaded and discharged during the washing/drying cycle), pumps, compressors, and the like.

The invention claimed is:

1. Washing and/or drying appliance having a circuit system comprising:
    an electric load adapted to be energized by electrical coupling between first and second supply terminals of an electric power supply,
    first and second switching elements operable between respective closed/opened states for coupling/decoupling the first and second power supply terminals to/from first and second load terminals of the electric load,
    a control unit for operating the first and second switching elements, and
    a conditioning arrangement having
    a unidirectional signal flow element coupled between the first supply terminal for receiving a supply signal and the second load terminal, and
    an impedance arrangement coupled between the first load terminal and the control unit, wherein, with the first and second switching elements in the opened-states the first supply terminal, the unidirectional signal flow element, the electric load and the impedance arrangement define a conductive path providing a check signal to the control unit,
    and wherein the control unit is configured for determining a fault in the circuit system based on the check signal.

2. The appliance according to claim 1, wherein the impedance arrangement is a voltage divider, so that the check signal is scaled, with respect to the supply signal, by a scaling factor of the voltage divider.

3. The appliance according to claim 1, wherein the impedance arrangement is powered between a reference voltage and an operative voltage, so that the check signal is also shifted, with respect to the supply signal, by a shifting voltage depending on said operative and reference voltages.

4. The appliance according to claim 3, wherein the control unit is powered between said operative and reference voltages so that the check signal falls between an operation swing of the control unit.

5. The appliance according to claim 1, wherein the first switching element is a door switch, and wherein in the closed-state the door switch allows a mechanical lock of an appliance door for preventing access to a treatment chamber of the appliance.

6. The appliance according to claim 1, wherein in absence of faults in the circuit system the check signal has a predetermined trend deriving from supply signal passage through said conductive path, a fault in the circuit system affecting the conductive path causing the trend of the check signal to mismatch said predetermined trend, and wherein:
    the control unit is configured for determining, with the first and second switching elements in the opened-states, a fault in the circuit system based on a mismatch between the trend of the check signal and the respective predetermined trend.

7. The appliance according to claim 6,
    wherein the supply signal has an alternating full-wave periodic waveform,
    and wherein with the first and second switching elements in the opened-states:
        the predetermined trend of the check signal has a half-wave periodic waveform,
        the control unit is configured for determining a leakage between the electric load and the first supply terminal when the actual trend of the check signal takes the full-wave periodic waveform.

8. The appliance according to claim 6, wherein
    with the first and second switching elements in the opened-states:
        the predetermined trend of the check signal has a predetermined peak value depending on sizing of the impedance arrangement, and
        the control unit is configured for determining a leakage between the electric load and the second supply terminal when the actual trend of the check signal takes the half-wave periodic waveform with a peak value lower than said predetermined peak value by a predefined threshold amount.

9. The appliance according to claim 6, further comprising a first further conditioning arrangement for providing a first further check signal,
    and wherein with the first and second switching elements in the opened-states:
        the predetermined trend of the check signal has a shifting voltage given by first impedance arrangement powering, and the predetermined trend of the first further check signal has the half-wave periodic waveform according to supply signal passage across the unidirectional signal flow element and the first further conditioning arrangement,
        the control unit is configured for determining a non-conductivity of the electric load when the actual trend of the check signal takes a constant trend at said shifting voltage and the actual trend of the first further check signal matches the respective predetermined trend.

10. The appliance according to claim 9, wherein with the first and second switching elements in the off-states:
    the control unit is configured for determining an unwanted on-state of the second switching element when the actual trend of the check signal takes the constant trend at said shifting voltage and the actual trend of the first further check signal takes a constant trend at the reference voltage.

11. The appliance according to claim 9, further comprising a further electric load between the first load terminal and a third load terminal,
   a third switching element operable for being switched to the second load terminal or to the third load terminal, the closed/opened state of the second switching element allowing coupling/decoupling thereof to/from the third switching element, and
   a second further conditioning arrangement for providing a second further check signal,
   wherein with the first and second switching elements in the off-states:
      the predetermined trend of the second further check signal has the half-wave periodic waveform deriving from passage of the supply signal across unidirectional signal flow element and the second further conditioning arrangement, and
      the control unit is configured for determining a non-conductivity of the further electric load when the actual trend of check signal matches the respective predetermined trend, and the actual trend of the second further check signal takes the constant trend at the reference voltage.

12. The appliance according to claim 11, wherein, the first further and second further conditioning arrangements comprise first further and second further unidirectional signal flow elements, with the first switching element in the on-state and the second switching element in the off-state the predetermined trends of the first further and second further check signals having the half-wave periodic waveforms deriving from passage of the supply signal across the first further and second further conditioning arrangements, respectively, and wherein
   with the first switching element in the closed-state, the second switching element in the opened-state and the third switching element switched towards the third load terminal:
      the control unit is configured for determining a non-conductivity of the further electric load or an unwanted on-state of the second switching element when the actual trend of the second further check signal takes the constant trend at the reference voltage.

13. The appliance according to claim 12, wherein, with the first switching element in the closed-state, the second switching element in the opened-state and the third switching element switched towards the second load terminal:
   the control unit is configured for determining a non-conductivity of the further electric load when the actual trend of the second further check signal takes the constant trend at the reference voltage, or
   the control unit is configured for determining a non-conductivity of the electric load or an unwanted on-state of the second switching element when the actual trend of the first further check signal takes the constant trend at the reference voltage.

14. The appliance according to claim 11, wherein, with the first and second switching elements in the closed-states and the third switching element switched towards the third load terminal:
   the predetermined trends of the first further and second further check signals have the half-wave periodic waveform and the constant trend at the reference voltage, respectively, and
   the control unit is configured for determining:
      an unwanted opened-state of the second switching element when the actual trends of the first further check signal matches the respective predetermined trend and the second further check signal takes the half-wave periodic waveform, or
      an unwanted switching of the third switching element towards the second load terminal when the actual trend of the first further check signal takes the constant trend at the reference voltage and the actual trend of the second further check signal takes the half-wave periodic waveform.

15. The appliance according to claim 11, wherein with the first and second switching elements in the closed-states and the third switching element switched towards the second load terminal:
   the predetermined trends of the first further and second further check signals have the constant trend at the reference voltage and the half-wave periodic waveform, respectively, and
   the control unit is configured for determining
      a non-conductivity of the further electric load when the actual trend of the second further check signal takes the constant trend at the reference voltage, or
      an unwanted off-state of the second switching element when the actual trend of the first further check signal takes the half-wave periodic waveform and the actual trend of the second further check signal matches the respective predetermined trend, or
      an unwanted switching of the third switching element towards the third load terminal when the actual trend of the first further check signal takes the half-wave periodic waveform and the actual trend of the second further check signal takes the constant trend at the reference voltage.

16. The appliance according to claim 11, wherein the third switching element is a two-way switch of the Single Pole Double Throw type or of the Single pole ChangeOver/Single pole Centre Off type.

17. The appliance according to claim 1, wherein the appliance is a laundry washing appliance, and wherein the electric load is a washing heater configured for heating washing water during a washing process performed by the appliance.

18. The appliance according to claim 1, wherein the appliance is a laundry drying appliance, and wherein the electric load is a drying heater configured for heating drying air during a drying process performed by the appliance.

19. The appliance according to claim 11, wherein the appliance is a laundry washing and drying appliance, and wherein the electric load is a washing heater configured for heating washing water during a washing process performed by the appliance, and the further electric load is a drying heater configured for heating drying air during a drying process performed by the appliance.

20. The appliance according to claim 1, wherein the appliance is a dishwashing appliance.

21. A method for determining faults in a circuit system of an appliance comprising:
   at least one electric load adapted to be energized by electrical coupling between first and second supply terminals of an electric power supply, at least two switching elements operable for coupling/decoupling the first and second supply terminals to/from first and second load terminals of the at least one electric load, and a control unit for operating the at least two switching elements, the method comprising, under the control of the control unit:

conditioning the supply signal from the first supply terminal into at least one check signal having, for each configuration of the at least two switching elements, a respective predetermined trend, and determining, for each selected configuration of the at least two switching elements, faults in the circuit system based on matches/mismatches between an actual trend of at least one of the at least one check signal and the respective predetermined trend.

22. The method according to claim 21, wherein
the at least one electric load comprises an electric load having first and second load terminals,
the supply signal has an alternating full-wave periodic waveform,
the at least two switching elements comprise first and second switching elements operable between closed/opened states for coupling/decoupling the first and second supply terminals to/from the first and second load terminals of the electric load, respectively,
the at least one check signal comprises a first check signal, the at least one conditioning arrangement comprises a first conditioning arrangement having a first unidirectional signal flow element coupled between the first supply terminal and the second load terminal, and wherein
with the first and second switching elements in the opened-states the predetermined trend of the check signal has a half-wave periodic waveform,
the method comprising determining a leakage between the electric load and the first supply terminal when, with the first and second switching elements in the opened-states, the actual trend of the check signal takes the full-wave periodic waveform.

23. The method according to claim 22, wherein:
the first conditioning arrangement further comprises a first impedance arrangement between the first load terminal and the control unit, and
with the first and second switching elements in the opened-states the predetermined trend of the check signal has a predetermined peak value depending on sizing of the impedance arrangement,
the method comprising determining a leakage between the electric load and the second supply terminal when, with the first and second switching elements in the opened-states, the actual trend of the check signal takes the half-wave periodic waveform with a peak value lower than said predetermined peak value by a predefined threshold amount.

24. The method according to claim 22, wherein
the at least one check signal further comprises a second check signal,
the at least one conditioning arrangement further comprises a second conditioning arrangement for providing said second check signal, and wherein
with the first and second switching elements in the opened-states the predetermined trend of the check signal has a shifting voltage given by first impedance arrangement powering, and the predetermined trend of the second check signal has the half-wave periodic waveform according to supply signal passage across the first unidirectional signal flow element and the second conditioning arrangement,
the method comprising determining a non-conductivity of the electric load when, with the first and second switching elements in the opened-states, the actual trend of the check signal takes a constant trend at said shifting voltage and the actual trend of the second check signal matches the respective predetermined trend.

25. The method according to claim 24, further comprising determining an unwanted on-state of the second switching element when, with the first and second switching elements in the off-states, the actual trend of the check signal takes the constant trend at said shifting voltage and the actual trend of the second signal takes a constant trend at a reference voltage.

* * * * *